(12) United States Patent
Park et al.

(10) Patent No.: US 6,229,567 B1
(45) Date of Patent: *May 8, 2001

(54) CHARGE COUPLED DEVICE TO ENABLE VIEWING OF A NORMAL OR A REVERSE IMAGE

(75) Inventors: Chan Park, Chungcheongbuk-do; In Kyou Choi, Seoul, both of (KR)

(73) Assignee: Hyundai Electronics Industries Co., Ltd., Kyoungki-Do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/874,625

(22) Filed: Jun. 13, 1997

(30) Foreign Application Priority Data

Dec. 16, 1996 (KR) ................................... 96-66207

(51) Int. Cl.⁷ ........................................................ H04N 5/335
(52) U.S. Cl. ............................................. 348/315; 348/316
(58) Field of Search ....................................... 348/294, 302, 348/303, 304, 311, 312, 315, 316, 317, 319, 320, 321, 322, 323; H04N 5/335

(56) References Cited

U.S. PATENT DOCUMENTS

| | | | |
|---|---|---|---|
| 5,043,819 | * 8/1991 | Cheon et al. | 348/316 |
| 5,060,072 | 10/1991 | Hojo et al. . | |
| 5,148,013 | * 9/1992 | Yamada | 348/316 |
| 5,398,063 | * 3/1995 | Yamana | 348/345 |
| 5,400,071 | * 3/1995 | Yamada | 348/316 |
| 5,757,427 | * 5/1998 | Miyaguchi | 348/243 |

* cited by examiner

Primary Examiner—Tuan Ho

(57) ABSTRACT

A charge coupled device of this invention includes photodiodes, VCCDs for shifting the image charges generated in the photodiodes in one direction or in the reverse direction, first HCCD formed on one sides of the VCCDs transmitting the image charges from the VCCDs in one direction, and second HCCD formed on the other side of the VCCDs transmitting the image charges to the VCCDs in the reverse direction.

21 Claims, 7 Drawing Sheets

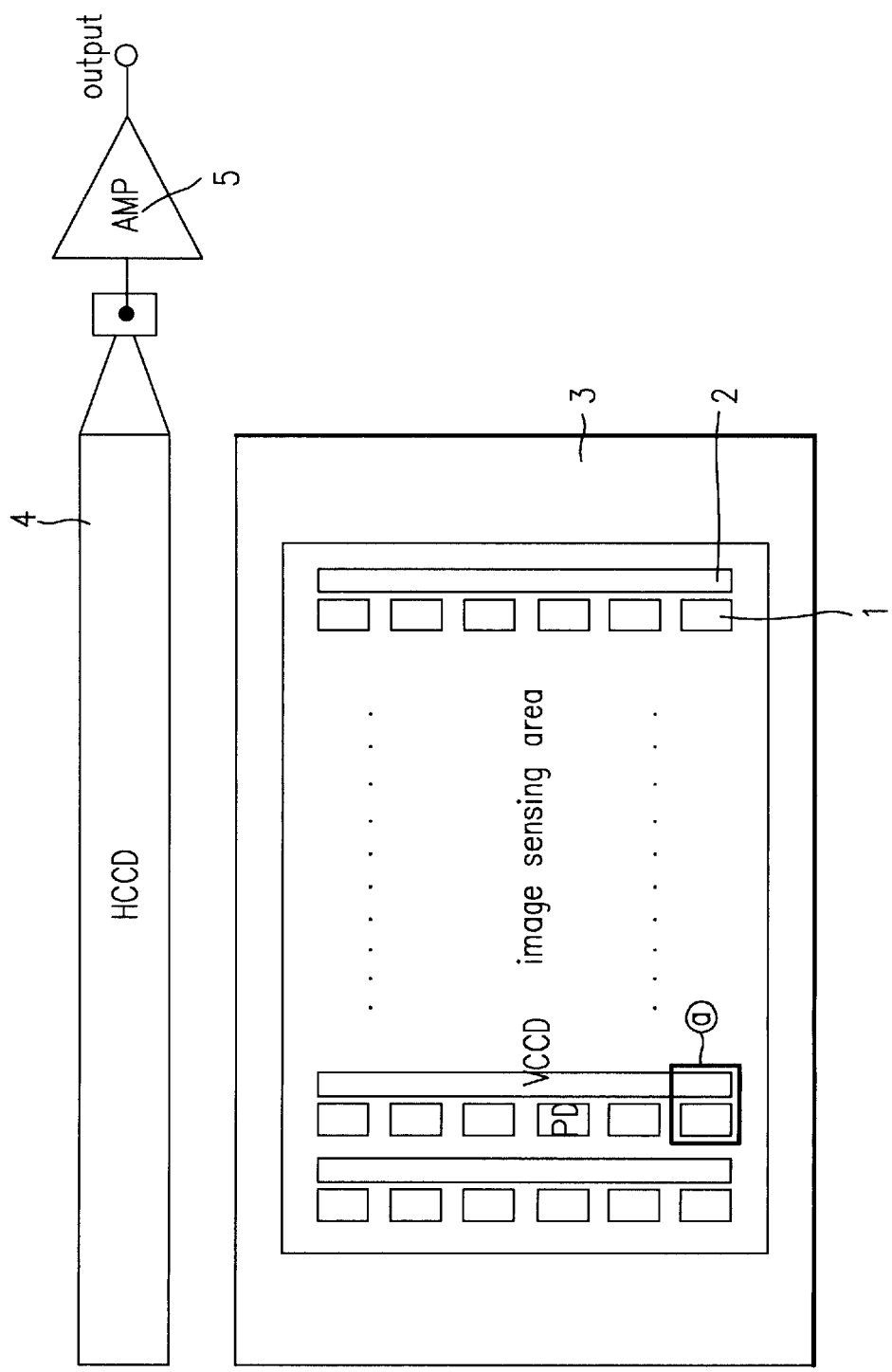

CHARGE COUPLED DEVICE TO ENABLE VIEWING OF A NORMAL OR A REVERSE IMAGE

BACKGROUND OF THE INVENTION

1. Field of the Invention

The present invention relates to a charge coupled device. More particularly, this invention relates to a charge coupled device enabling an image recording/reproducing medium such as a camcorder to realize a reverse image.

2. Discussion of Related Art

A reverse image is the image of which left, right, upper and lower directions are changed by regulating the angle of the LCD for use of a view finder attached to a camcorder, so that a person who is taken a picture of can directly view the screen from the position where he is.

With reference to the attached drawings, a conventional charge coupled device will be described below.

As illustrated in FIG. 1, the conventional charge coupled device includes: a plurality of matrix-type photo diode areas 1 formed on an image sensing area; a plurality of VCCDs 2 formed vertically to one side of each photo diode area 1, and transmitting charges formed in the photo diode areas; an optical black area 3 formed around the image sensing area; an HCCD 4 formed on one side of each VCCD 2 and transmitting the signal charges transmitted through the VCCDs 2 in a horizontal direction; and a sensing amplifier 5 formed on one side of the HCCD 4, sensing the transmitted charges and outputting them to outside.

A unit cell, a part of FIG. 1, of the above-mentioned charge coupled device is structured as follows.

As illustrated in FIGS. 2A to 2C, the unit cell includes: a first p type well 7 formed on an n type semiconductor substrate 6; a photo diode area 8 formed of a PD-N layer and a PD-P layer on the first p-type well 7; a high concentration p type impurity diffusion area 11 formed on the photo diode area 8 excluding one side of the area 8 to which the signal charges are transferred, and therefore used as a channel stop layer; a second p type well 9 formed on the portion of the first p type well 7 where the photo diode area and high concentration p type impurity diffusion area 11 are not formed; an N type impurity diffusion area 10 formed in the second p type well 9 and used for the VCCD area; first and second polysilicon gate electrodes 12 (the first polysilicon gate electrode is not shown in FIG. 2B) insulated by first insulating layer 13 which is formed on the overall surface of the substrate, and formed on the n type impurity diffusion area 10; a light blocking metal layer 14 formed on a portion other than the photo diode area 8; a second insulating layer 15 formed on the overall surface of the substrate; a color filter layer 16 formed on the second insulating layer 15 on the photo diode area 8, and transmitting a radiation of a specific wave; a third insulating layer 17 formed on the overall surface of the substrate including the color filter layer 16; and a micro lens 18 formed on the third insulating layer 17 on the color filter layer 16 and thus focusing light.

Here, the first insulating layer 13 is made up with a gate insulating layer which is formed on the overall substrate before the first polysilicon gate electrode is formed, and an insulating layer formed on the second polysilicon gate electrode.

A potential profile of the thus-structured charge coupled device's photo diode area is shown in FIG. 2C. The photo diode area 8 and its lower side are made up with the PD-P, PD-N, the first p type well, and the n type semiconductor substrate.

The PD-N area is fully depleted by the PD-P and the first p type well. Here, the highest potential of the PD-N area is the photo diode pinch-off voltage.

In FIG. 2C, Vsdl indicates the lowest voltage of the first p type well. Vsht is the vertical potential profile. Vofd is DC voltage applied to the n type semiconductor substrate.

A charge transmitting operation of the conventional charge coupled device will be described below.

FIG. 3 is a sectional view of the VCCD area. The first and second polysilicon gate electrodes are alternatively formed on the VCCD area. The signal charges, placed in the VCCD area under the first and second polysilicon gate electrodes to which vertical clock signals $V\phi 1$, $V\phi 2$ are applied at the time point T=1, are shifted under the first and second polysilicon gate electrodes to which the next vertical clock signals $V\phi 1$, $V\phi 2$ are applied at the time point T=9, by using the clock signal applied to the VCCD. A rising time (RT) of the clock signal applied to the VCCD area may be fast, but the falling time (FT) should not be too fast because the signal charges are not shifted in the foregoing direction, but remain or shift to the reverse direction, thereby lowering the charge transmitting efficiency.

The image recording/reproducing medium such as the camcorder using the conventional solid state device multi-functions to thereby provide the user specific services. The camcorder should provide the above-mentioned reverse image which enables the object, a people to watch the picture screen from the position where he is filmed.

However, the conventional charge coupled device displays the image in a reverse way because the transmission of the signal charge is made in one direction.

SUMMARY OF THE INVENTION

Accordingly, the present invention is directed to a charge coupled device that substantially obviates one or more of the problems due to limitations and disadvantages of the related art.

An object of the present invention is to provide a charge coupled device realizing a reverse image in the image recording/reproducing medium such as a camcorder.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the charge coupled device having a plurality of photo diodes, a plurality of VCCDs for shifting the image charges generated in the plurality of photo diodes by the variation of the potential well, The device further includes first and second HCCDs each formed on one side and the other side of the VCCD in parallel, for selectively transmitting the image charges transmitted from the VCCD in the opposite directions.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a layout of a conventional charge coupled device;

DETAILED DESCRIPTION OF PREFERRED EMBODIMENT

Reference will now be made in detail to the preferred embodiments of the present invention, examples of which are illustrated in the accompanying drawings.

Figure 2A:
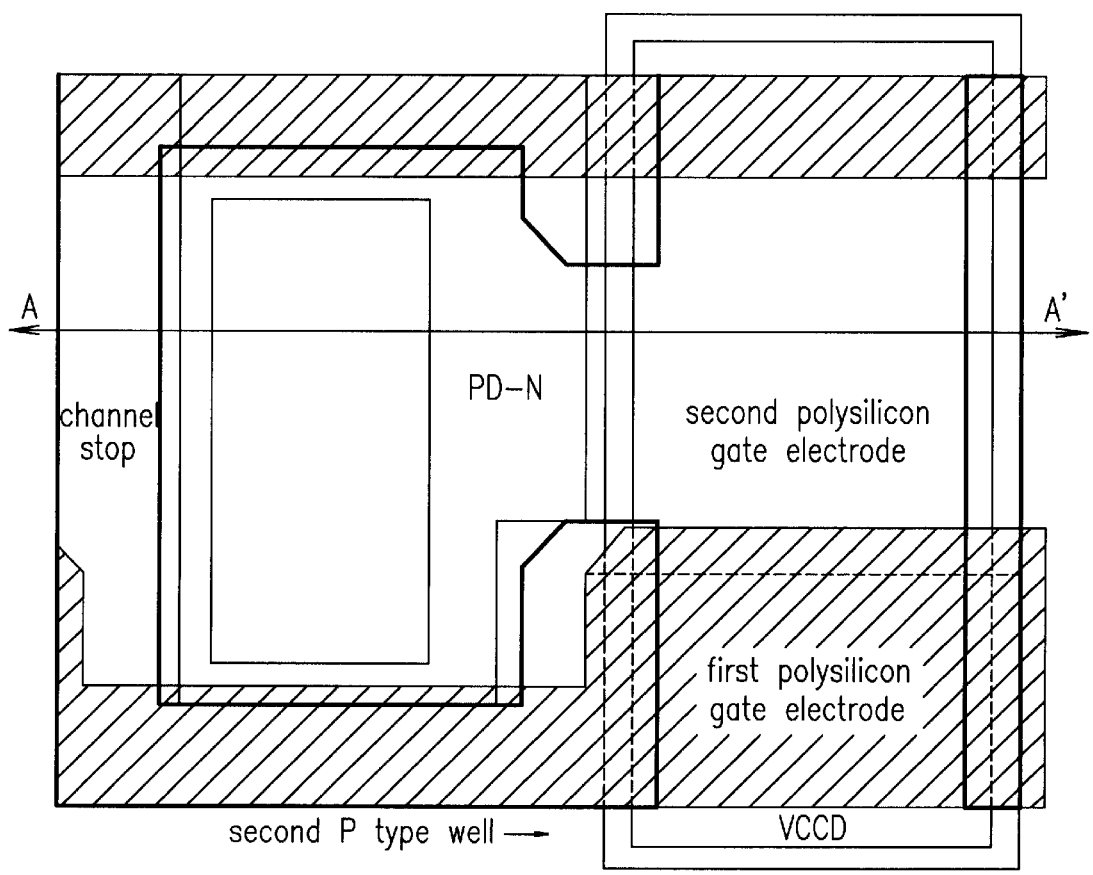
FIGS. 2A to 2C illustrate the horizontal and vertical structures of a unit cell and a potential profile of the conventional solid state charged coupled device.
Figure 2B:
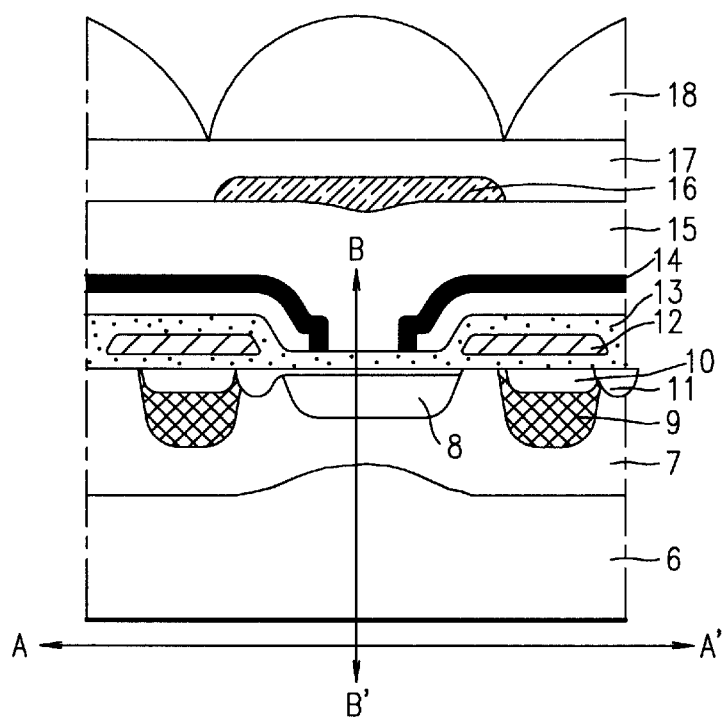
Figure 2C:
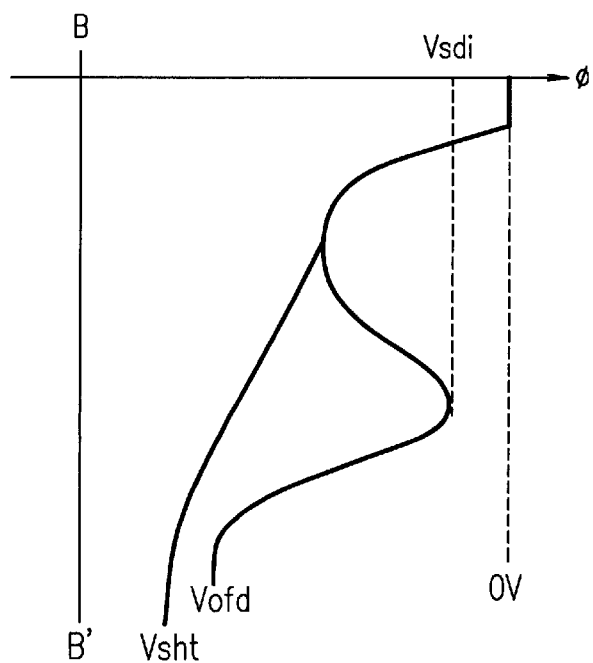
Figure 3:
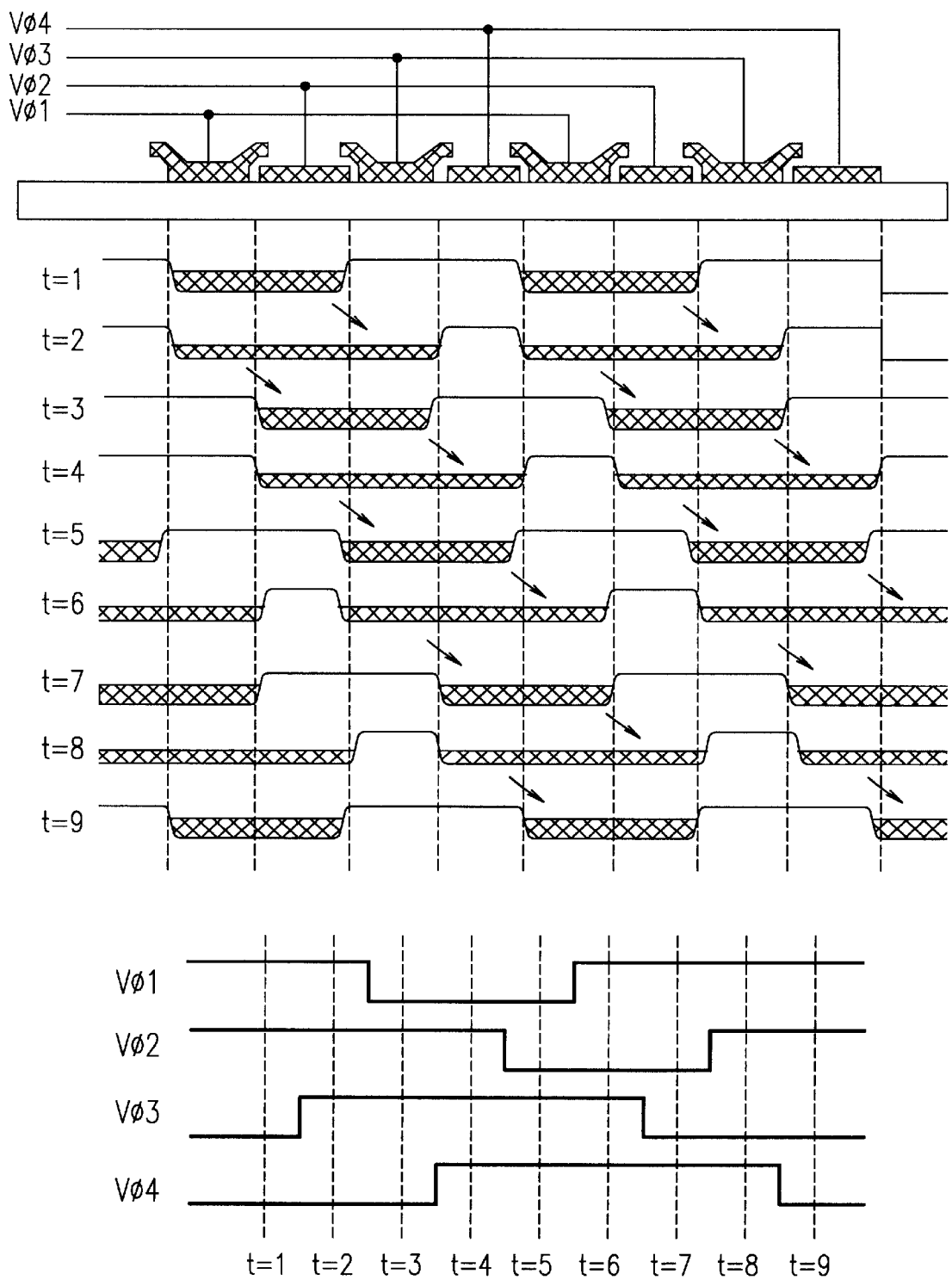
FIG. 3 is a potential profile showing the charge transmitting operation of the conventional charge coupled device.
Figure 4:
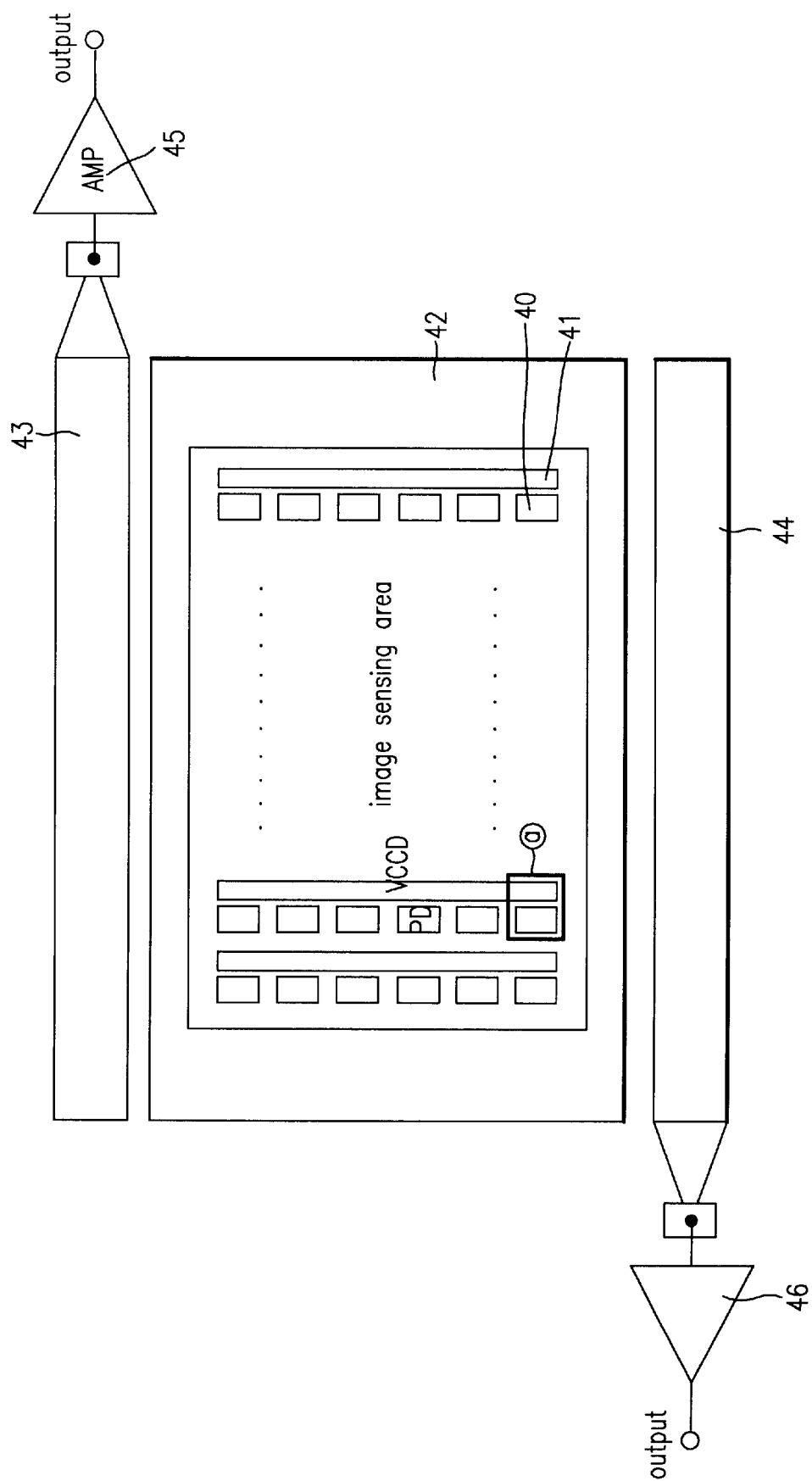
FIG. 4 is a layout of a charge coupled device of an embodiment of the present invention.

As illustrated in FIGS. 4 and 5, a charge coupled device of the invention includes: a plurality of photo diode areas 40 formed in the form of a matrix on an image sensing area; a plurality of VCCDs 41 vertically formed in one side of each photo diode area 40 and transmitting the charges generated in the photo diode areas 40 bilaterally; an optical black area 42 formed around the image sensing area; a first HCCD 43 formed on one side of each VCCD 41 and horizontally transmitting the signal charges transmitted from the plurality of VCCDs 41; a second HCCD 44 formed on the other side of each VCCD 41 and transmitting the signal charges transmitted through the plurality of VCCDs 41 in the reverse direction to the first HCCD 43; and sensing amplifiers 45 and 46 each formed on one side of the first and second HCCDs 43 and 44, sensing the transmitted charges and outputting them to outside. Here, the widths of the optical black area 42 formed around the image sensing area are the same omnidirectionally.

A plurality of first and second polysilicon gate electrodes (illustrated in FIGS. 5A and 5B), formed on the plurality of VCCDs 41, repeatedly receive vertical clock signals V$\phi$1, V$\phi$2, V$\phi$3, V$\phi$4 and the shifted vertical clock signals $\overline{V\phi 1}$, $\overline{V\phi 2}$, $\overline{V\phi 3}$, $\overline{V\phi 4}$(not shown) having shifted phase to the vertical clock signals V$\phi$1–V$\phi$4.

The first and second HCCDs 43 and 44 each have the first and second polysilicon gate electrodes (not shown). Horizontal clock signals H$\phi$1, H$\phi$2 (not shown) are repeatedly applied to the first and second polysilicon gate electrodes on the first HCCD area 43, when a user wants the normal screen. Or, the inverted horizontal clock signals $\overline{H\phi 1}$, $\overline{H\phi 2}$ (also not shown) are applied to the first and second polysilicon gate electrodes on the second HCCD area 44, when the user wants the reversed screen. That is, if the charges are transmitted by the first HCCD 43, the screen displays the normal image. And if the charges are transmitted by the second HCCD 44, the screen displays the reversed image.

A charge transmitting operation of the thus-structured charge coupled device will be described below.

Figure 5A:
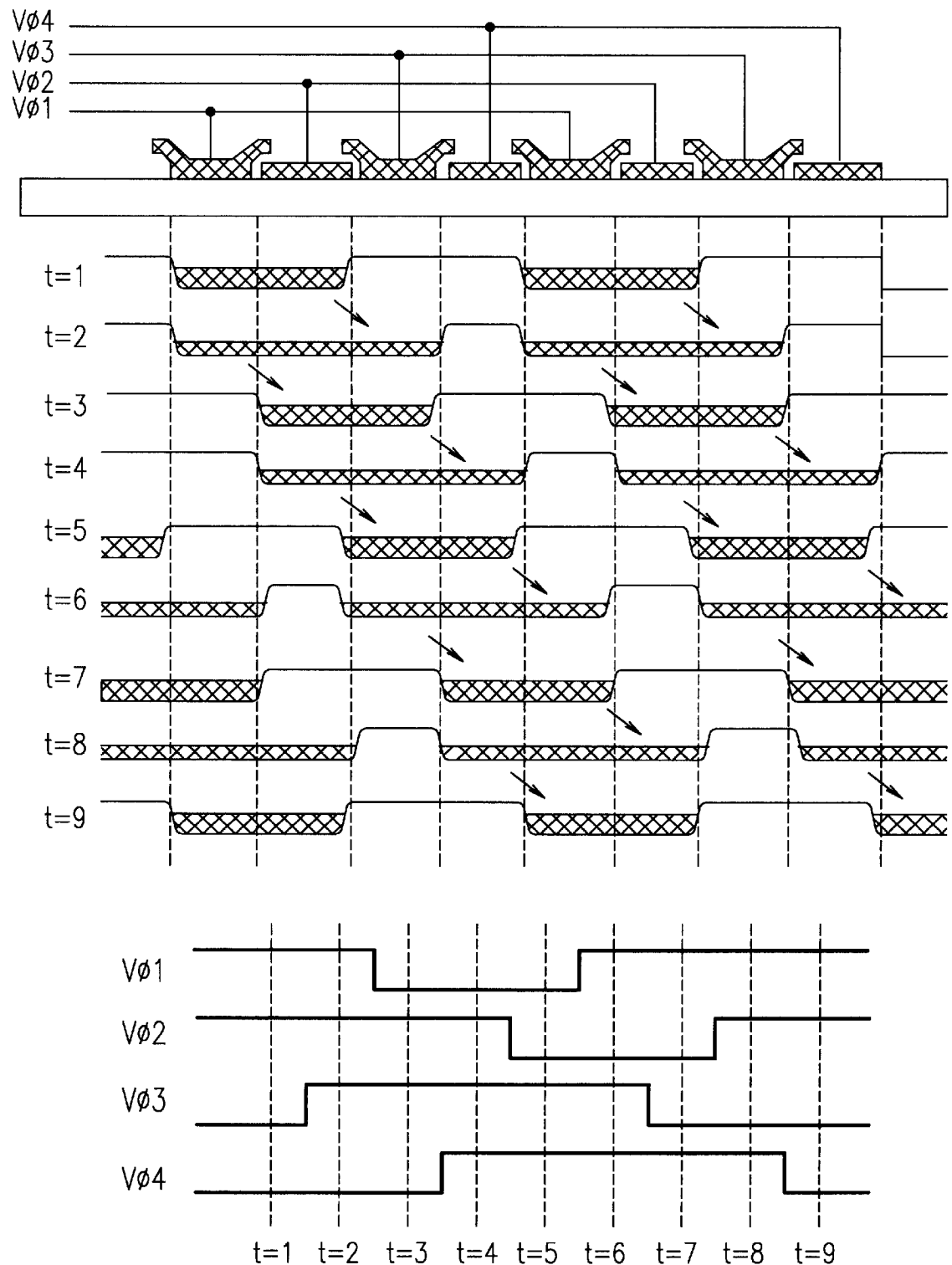
FIG. 5A and 5B are potential profiles showing the charge transmitting operation of the charge coupled device of an embodiment of the present invention.

FIG. 5A shows the normal charge transmitting operation. The normal vertical clock signals V$\phi$1, V$\phi$2, V$\phi$3, V$\phi$4 are applied to the first and second polysilicon gate electrodes on the VCCD 41, so that the signal charges are transmitted in the direction of the first HCCD 43. The horizontal clock signals H$\phi$1, H$\phi$2 are applied to the first and second polysilicon gate electrodes of the first HCCD 43, and sensed by the sensing amplifier 45.

Figure 5B:
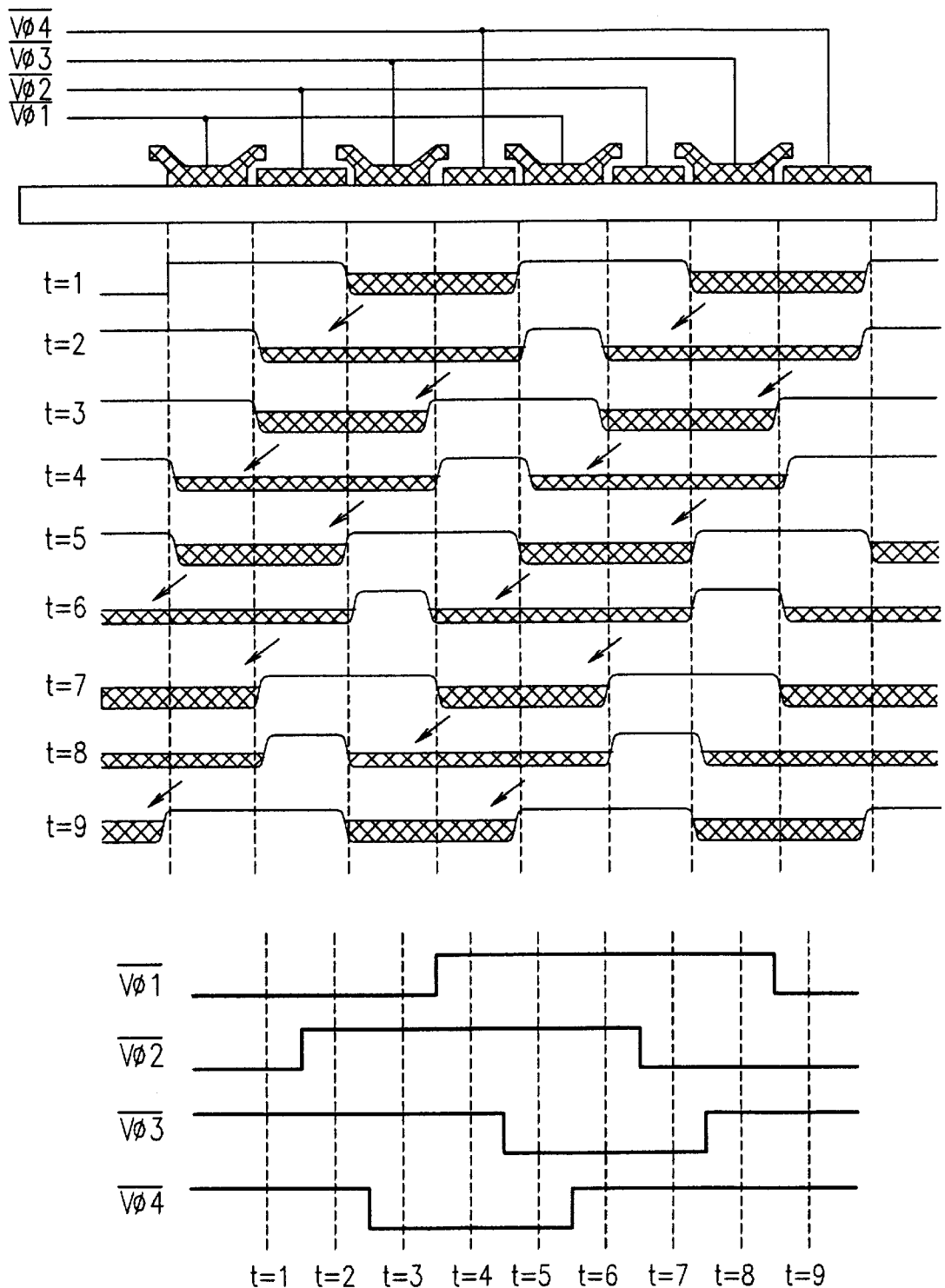

FIG. 5B illustrates the charge transmission operation procedures for viewing the reversed image. The shifted vertical clock signals $\overline{V\phi 1}$, $\overline{V\phi 2}$, $\overline{V\phi 3}$, $\overline{4\phi 4}$ are applied to the first and second polysilicon gate electrodes of the VCCD 41 to thereby transmit the signal charges in the direction of the second HCCD 44. The inverted horizontal clock signals $\overline{H\phi 1}$, $\overline{H\phi 2}$ are applied to the first and second polysilicon gate electrodes on the second HCCD area 44, and sensed by the sensing amplifier 46.

The image recording/reproducing medium, using the charge coupled device records the moving pictures as follows. That is, when the object person wants to see the screen from the position where he is while a user takes a picture, seeing the normal screen such as the LCD screen using the view finder of the camcorder or the screen using LCD remotely attached, the inverted clock signals are applied to and senses the signal charges in the reversed order to thereby display the images.

The thus-operated charge coupled device of the invention can realize the images which are not reversed along a right-left direction thereby enhancing the applicability to the image recording/reproducing medium of the highly multi-functioned camcorder.

It will be apparent to those skilled in the art that various modifications and variations can be made in the charge coupled device of the present invention without departing from the spirit or scope of the invention. Thus, it is intended that the present invention cover the modifications and variations of this invention provided they come within the scope of the appended claims and their equivalents.

What is claimed is:

1. A charge coupled device, comprising:
   a plurality of photo diode areas arranged in the form of a matrix, receiving the image signals with respect to lights and then generating charges corresponding to the images;
   a plurality of VCCDs for shifting the image charges generated in the photo diode areas according to a potential well variation;
   a plurality of first and second polysilicon gate electrodes insulatedly formed on the VCCDs, and making the charge transmission direction of the VCCDs take on a first direction by vertical clock signals V$\phi$1, V$\phi$2, V$\phi$3, V$\phi$4 or take on a second direction by shifted vertical clock signals $\overline{V\phi 1}$, $\overline{V\phi 2}$, $\overline{V\phi 3}$, $\overline{V\phi 4}$;
   first and second HCCDs formed respectively on one side and the other side of the VCCDs and thereby transmitting the image charges transmitted through the VCCDs in the first and second directions, respectively, to form one of a normal image and a reverse image;
   a first sensing amplifier formed on one side of the first HCCD, and externally sensing and outputting the transmitted image charges; and
   a second sensing amplifier formed on one side of the second HCCD, sensing and outputting the transmitted image charges to outside.

2. The device as claimed in claim 1, wherein an optical black area is formed around the image sensing area having the photo diode areas and VCCDs.

3. The device as claimed in claim 2, wherein the widths of the optical black area are the same omnidirectionally.

4. The device as claimed in claim 1, wherein if the clock signals V$\phi$1, V$\phi$2, V$\phi$3, V$\phi$4 are applied to the first and second polysilicon gate electrodes on the VCCD, the image charges are transmitted to the first HCCD and the image charges are shifted in the horizontal direction by the first HCCD.

5. The device as claimed in claim 1, wherein if the shifted vertical clock signals $\overline{V\phi1}, \overline{V\phi2}, \overline{V\phi3}, \overline{V\phi4}$ are applied to the first and second polysilicon gate electrodes on the VCCD, the image charges are transmitted to the second HCCD, and the image charges are shifted in the horizontal direction by the second HCCD.

6. The device as claimed in claim 1, wherein a plurality of first and second polysilicon gate electrodes are formed on said first and second HCCDs, so that horizontal clock signals $H\phi1, H\phi2$ are selectively applied to the polysilicon gate electrodes.

7. A charge coupled device, comprising:
 a plurality of photo diodes for generating image charges;
 a plurality of VCCDs for transmitting said image charges in a first direction or in a second direction, wherein each VCCD is operable to transmit image charges in either said first or said second direction;
 a first HCCD formed on a first side of said plurality of VCCDs to receive and output said image charges transmitted in said first direction and so form a normal image; and
 a second HCCD formed on a second side of said plurality of VCCDs to receive and output said image charges transmitted in said second direction and so form a reverse image.

8. The device as claimed in claim 7, wherein a plurality of first and second polysilicon gate electrodes are formed on the VCCD, and repeatedly receive vertical clock signals $V\phi1, V\phi2, V\phi3, V\phi4$ or shifted vertical clock signals $\overline{V\phi1}, \overline{V\phi2}, \overline{V\phi3}, \overline{V\phi4}$.

9. The device as claimed in claim 8, wherein the first polysilicon gate electrode and second polysilicon gate electrode are insulated from each other respectively.

10. The device as claimed in claim 8, wherein when the vertical clock signals $V\phi1, V\phi2, V\phi3, V\phi4$ are applied to the first and second polysilicon gate electrodes on the VCCD, the image charges are transmitted to the first HCCD.

11. The device as claimed in claim 8, wherein when the shifted vertical clock signals $\overline{V\phi1}, \overline{V\phi2}, \overline{V\phi3}, \overline{V\phi4}$ are applied to the first and second polysilicon gate electrodes on the VCCD, the image charges are transmitted to the second HCCD.

12. The device as claimed in claim 7, wherein a plurality of first and second polysilicon gate electrodes to which horizontal clock signals $H\phi1, H\phi2$ are repeatedly applied are formed on the first and second HCCDs.

13. The device as claimed in claim 12, wherein the first and second polysilicon gate electrodes are insulated from each other.

14. The device as claimed in claim 12, wherein the horizontal clock signals $H\phi1, H\phi2$ are selectively applied to the first and second polysilicon gate electrodes of either one of the first and second HCCDs.

15. A device as claimed in claim 7, wherein each of said plurality of VCCDs include a plurality of gate electrodes receiving a plurality of vertical clock signals when transmitting said image charges in said first direction and receiving a plurality of shifted vertical clock signals when transmitting said image charges in said second direction.

16. A device as claimed in claim 15, wherein said plurality of vertical clock signals include vertical clock signals $V\phi1, V\phi2, V\phi3,$ and $V\phi4$, and said plurality of shifted vertical clock signals include $\overline{V\phi1}, \overline{V\phi2}, \overline{V\phi3},$ and $\overline{V\phi4}$.

17. A device as claimed in claim 7, wherein said first and second HCCDs each include a plurality of gate electrodes.

18. A device as claimed in claim 17, wherein said plurality of gate electrodes of said first HCCD receive a plurality of horizontal clock signals, activating said plurality of horizontal clock signals causing said first HCCD to receive said image charges in said first direction from said plurality of VCCDs.

19. A device as claimed in claim 18, wherein said plurality of horizontal clock signals include $H\phi1$ and $H\phi2$.

20. A device as claimed in claim 18, wherein said plurality of gate electrodes of said second HCCD receive a plurality of inverted horizontal clock signals, said plurality of inverted horizontal clock signals causing said second HCCD to receive said image charges in said second direction from said plurality of VCCDs.

21. A device as claimed in claim 20, wherein said plurality of inverted horizontal clock signals include $\overline{H\phi1}$ and $\overline{H\phi2}$.

* * * * *